(12) United States Patent
Kallfelz et al.

(10) Patent No.: US 9,619,612 B2
(45) Date of Patent: Apr. 11, 2017

(54) TESTER FOR EQUIPMENT, APPARATUS, OR COMPONENT WITH DISTRIBUTED PROCESSING FUNCTION

(71) Applicants: Andrew F. Kallfelz, Jamestown, RI (US); Gary T. Rumsey, Exeter, RI (US)

(72) Inventors: Andrew F. Kallfelz, Jamestown, RI (US); Gary T. Rumsey, Exeter, RI (US)

(73) Assignee: Battery Technology Holdings, LLC, Newport, RI (US)

( * ) Notice: Subject to any disclaimer, the term of this patent is extended or adjusted under 35 U.S.C. 154(b) by 865 days.

(21) Appl. No.: 13/573,893

(22) Filed: Oct. 15, 2012

(65) Prior Publication Data

US 2014/0107976 A1    Apr. 17, 2014

(51) Int. Cl.
| | |
|---|---|
| *G06F 19/00* | (2011.01) |
| *H01M 10/42* | (2006.01) |
| *G01R 31/36* | (2006.01) |
| *G01R 31/00* | (2006.01) |

(52) U.S. Cl.
CPC ......... *G06F 19/00* (2013.01); *G01R 31/3627* (2013.01); *G01R 31/3689* (2013.01); *H01M 10/4285* (2013.01); *G01R 31/007* (2013.01)

(58) Field of Classification Search
CPC ....................................................... G06F 19/00
USPC ....................................................... 702/182
See application file for complete search history.

(56) References Cited

U.S. PATENT DOCUMENTS

| | | | |
|---|---|---|---|
| 3,873,911 A | 3/1975 | Champlin | |
| 4,361,809 A | 11/1982 | Bil | |
| 5,699,346 A | 12/1997 | VanDervort | |
| 5,744,962 A | 4/1998 | Alber | |
| 6,051,976 A | 4/2000 | Bertness | |
| 6,064,721 A | 5/2000 | Mohammadian et al. | |
| 6,081,098 A | 6/2000 | Bertness | |
| 6,091,245 A | 7/2000 | Bertness | |
| 6,313,608 B1 | 11/2001 | Bertness | |
| 6,331,762 B1 | 12/2001 | Bertness | |
| 6,351,102 B1 | 2/2002 | Troy | |
| 6,359,442 B1 * | 3/2002 | Henningson et al. | 324/426 |
| 6,385,300 B1 | 5/2002 | Mohammadian et al. | |
| 6,445,158 B1 | 9/2002 | Bertness et al. | |
| 6,586,941 B2 | 7/2003 | Bertness | |
| 6,590,963 B2 | 7/2003 | Mohammadian et al. | |
| 6,704,629 B2 | 3/2004 | Huang | |
| 6,738,454 B2 | 5/2004 | Mohammadian et al. | |
| 6,759,849 B2 | 7/2004 | Bertness | |
| 6,791,464 B2 | 9/2004 | Huang | |
| 6,871,151 B2 | 3/2005 | Bertness | |

(Continued)

*Primary Examiner* — Manuel L Barbee
*Assistant Examiner* — Raymond Nimox
(74) *Attorney, Agent, or Firm* — Michael de Angeli

(57) ABSTRACT

A tester for equipment, apparatuses, or components with distributed measurement and analytical functions comprises a simplified test circuit for obtaining key data representative of the operational characteristics of said equipment, apparatus, or component and transmitting these to a sophisticated device capable of other uses, such as a smart phone or tablet computer. The latter analyzes the raw data with reference to values for nominal characteristics or operation of the equipment, apparatus, or component and provides a result indicative of the condition thereof.

44 Claims, 4 Drawing Sheets

(56) References Cited

U.S. PATENT DOCUMENTS

| | | | |
|---|---|---|---|
| 6,909,287 B2 | 6/2005 | Bertness | |
| 6,967,484 B2 | 11/2005 | Bertness | |
| 7,003,411 B2 | 2/2006 | Bertness | |
| 7,209,813 B2 | 4/2007 | Namaky | |
| 7,212,006 B2 | 5/2007 | Huang | |
| 7,446,536 B2 | 11/2008 | Bertness | |
| 7,728,597 B2 | 6/2010 | Bertness | |
| 7,902,828 B2 | 3/2011 | Huang | |
| 7,924,015 B2 | 4/2011 | Bertness | |
| 7,928,735 B2 | 4/2011 | Huang et al. | |
| 2002/0003423 A1* | 1/2002 | Bertness et al. | 324/426 |
| 2002/0036504 A1* | 3/2002 | Troy et al. | 324/430 |
| 2003/0088375 A1* | 5/2003 | Bertness et al. | 702/63 |
| 2004/0046566 A1* | 3/2004 | Klang | 324/429 |
| 2004/0263176 A1* | 12/2004 | Vonderhaar et al. | 324/426 |
| 2005/0021475 A1* | 1/2005 | Bertness et al. | 705/63 |
| 2005/0052187 A1* | 3/2005 | Bertness | 324/503 |
| 2005/0162172 A1* | 7/2005 | Bertness | 324/426 |
| 2005/0206388 A1* | 9/2005 | Quint | H01M 10/48 324/430 |
| 2006/0006876 A1* | 1/2006 | Bertness | 324/426 |
| 2006/0125483 A1* | 6/2006 | Bertness | 324/426 |
| 2006/0282227 A1* | 12/2006 | Bertness | 702/63 |
| 2008/0204030 A1* | 8/2008 | Brown et al. | 324/426 |
| 2009/0051365 A1* | 2/2009 | Bertness | 324/503 |
| 2010/0174446 A1* | 7/2010 | Andreasen et al. | 701/33 |
| 2012/0166240 A1* | 6/2012 | Jones et al. | 705/7.12 |
| 2012/0245871 A1 | 9/2012 | Sheng | |

\* cited by examiner

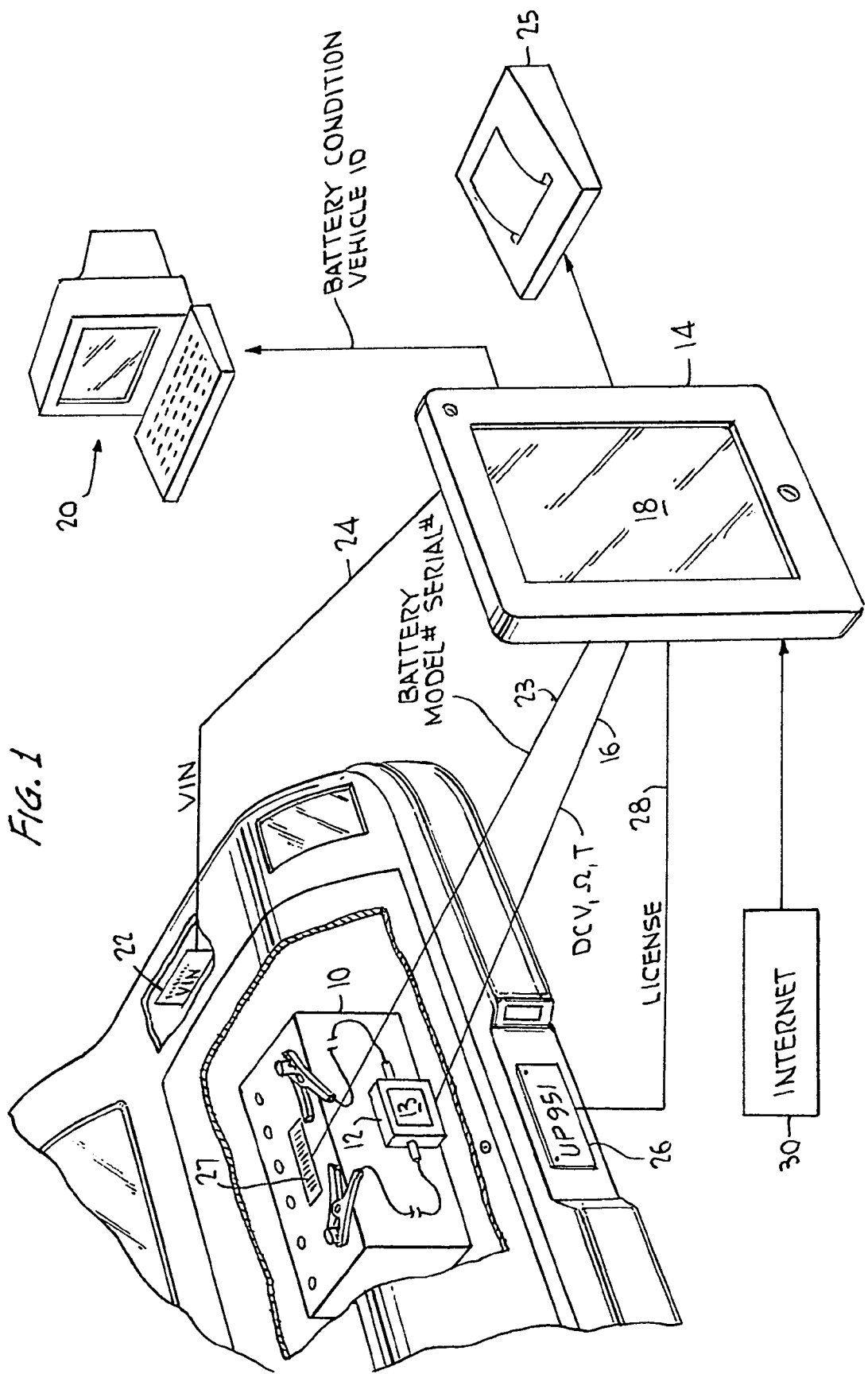

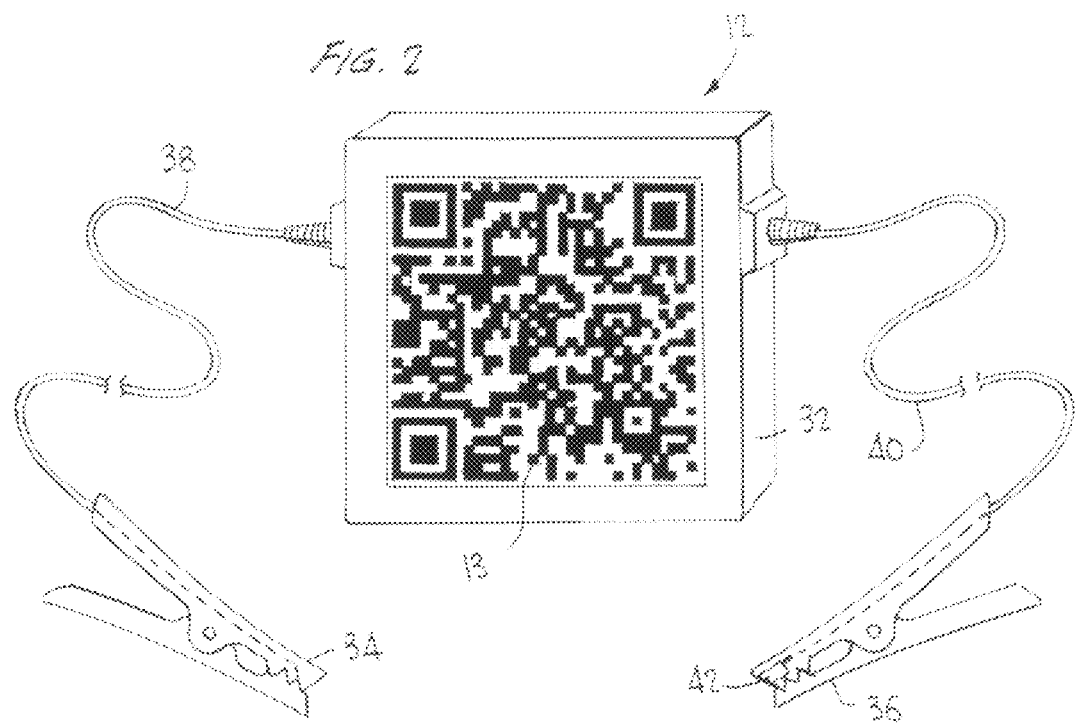
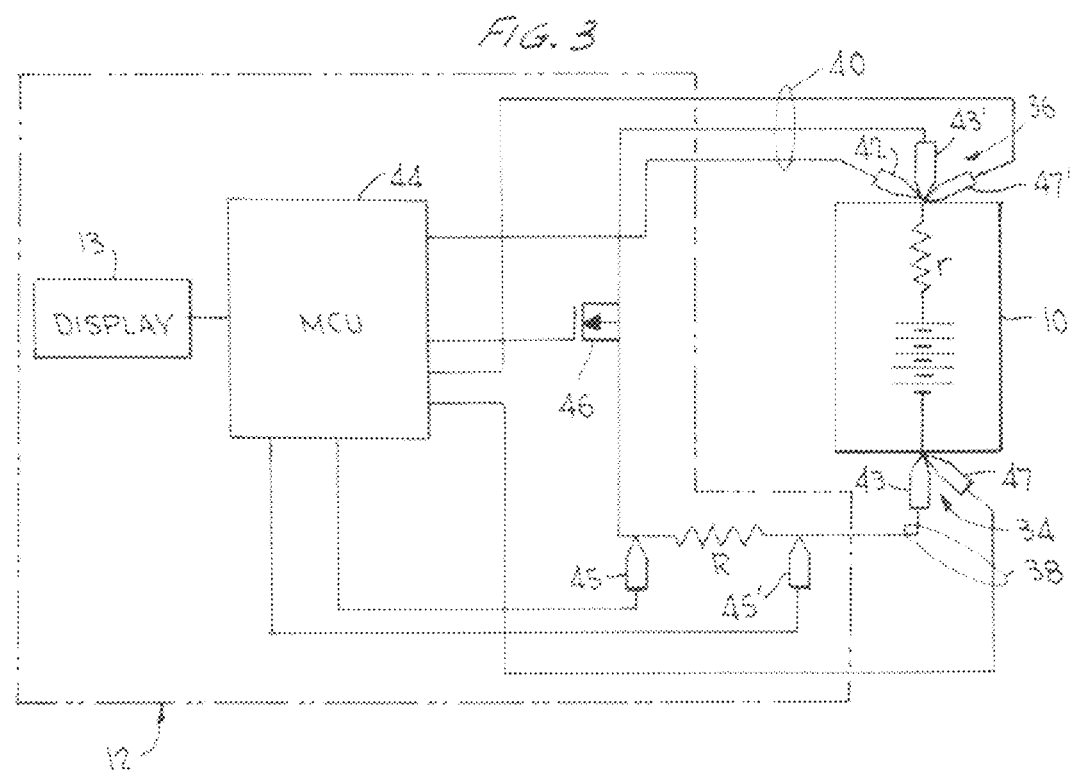

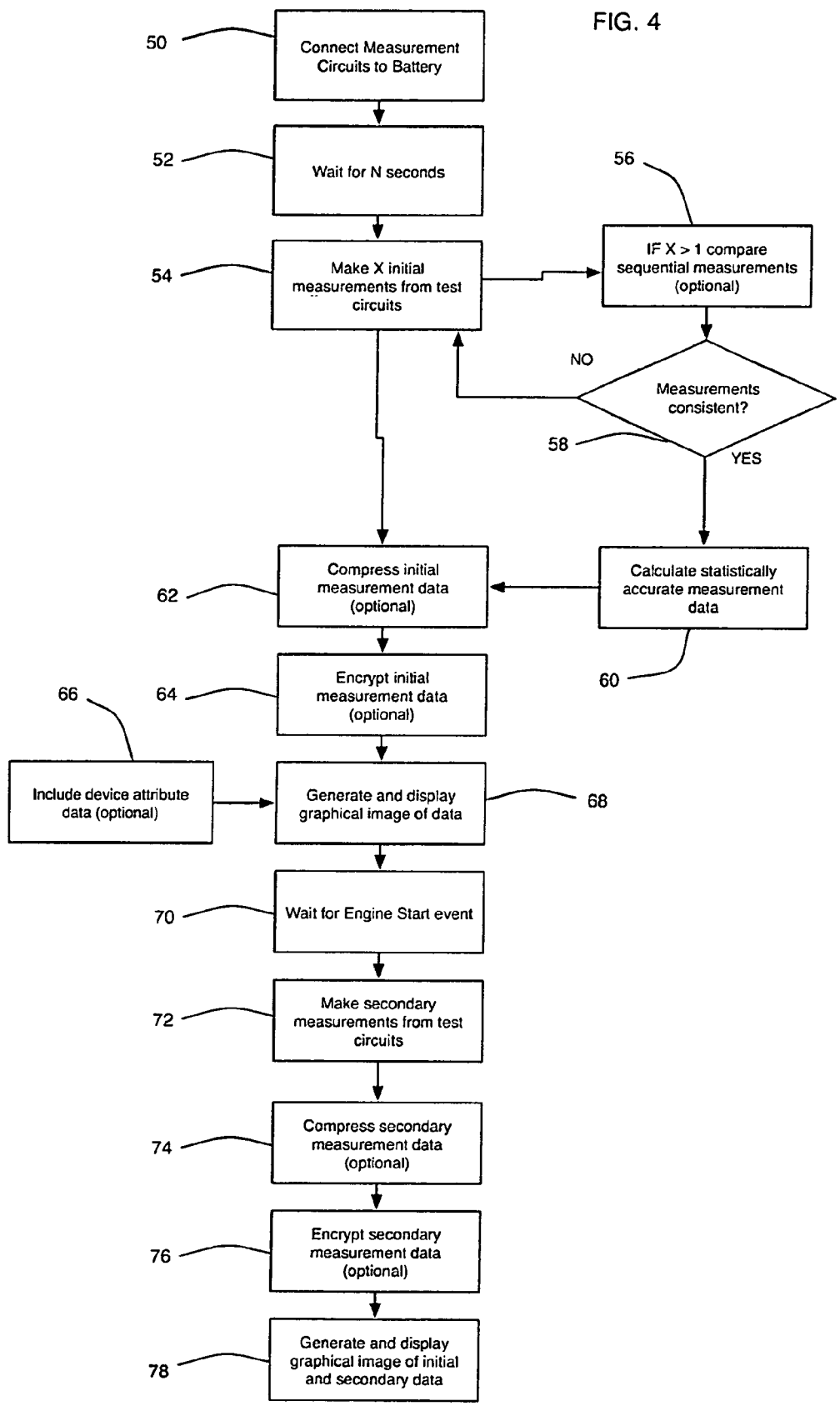

TESTER FOR EQUIPMENT, APPARATUS, OR COMPONENT WITH DISTRIBUTED PROCESSING FUNCTION

FIELD OF THE INVENTION

The present invention relates to a tester for various types of equipment, apparatuses, or components, that is, to equipment used to measure useful parameters of a piece of equipment, an apparatus, or a component, and for subsequent analysis of the parameters derived from the test. In particular, this invention relates to a tester for equipment, apparatuses, or components, having distributed functions, wherein a simplified testing device measures fundamental parameters of a piece of equipment, an apparatus, or a component, and transmits this raw data to a separate smart device capable of other uses—such as a smart phone or tablet computer—for analysis, manipulation, and interpretation of the test results to determine the condition of the equipment, apparatus, or component, and optionally for communication of the condition data to a further destination, for example, from the smart device of an auto dealer's technician to the service manager's computer.

The tester of the invention is described in detail herein with respect to a battery tester, but as noted above is not limited thereto. In this embodiment, a simplified battery testing device is connected to the terminals of a battery for performance of certain tests, and then communicates the raw data resulting therefore to a smart device for analysis—for example, comparison of measured parameters of the battery to values expected of a battery in good condition—and further appropriate action.

BACKGROUND OF THE INVENTION

Batteries have been commonly used in many applications for years to provide critical electrical energy to a wide range of applications. For example, batteries are widely used in the automotive industry to provide cranking energy to start an engine, to energize accessory loads in a vehicle and more recently to supply electricity to electric motors that provide the motive force for the vehicle. Batteries are also used in many industrial applications to energize indoor vehicle equipment or to provide back-up/standby power to critical equipment such as computers or telecommunications gear in the event of a utility power failure.

Because of the ubiquitous use of batteries in so many applications, it has become important to understand the health of the battery such that the reliability of the primary application is assured. A number of battery testing and monitoring methods have been developed over the past 50 or more years to provide critical information about battery health. The most basic methods include measuring specific gravity of the electrolyte, or measuring voltage and also voltage under a particular load. Measurements of voltage under load are interpreted by the device or by the user of the device to determine the health of the battery.

These methods have been largely replaced over the past 30 years by electronic testing methods that are generally referred to as "ohmic" testing methods, wherein the internal resistance of the battery is measured and compared to a reference value. Exemplary ohmic battery testing methods are described in U.S. Pat. Nos. 6,704,629 and 7,212,006 to Huang, U.S. Pat. No. 5,744,962 to Alber, U.S. Pat. No. 3,873,911 to Champlin, and many others.

Generally, these ohmic test methods are considered to more efficiently and more reliably indicate battery health than traditional load testing methods or specific gravity testing methods. However, ohmic test devices are generally quite costly compared to the equipment required for the more traditional test methods.

Furthermore, ohmic testers as commercially implemented are "integrated", that is, they perform both the measurement and analysis functions. Such integrated battery testers are provided, for example, with test leads to be connected to the battery so that raw data parameters can be measured, and are further provided with a keypad or the like whereby the user can input several items of data to the device concerning the specifications of a battery under test, and with a microprocessor, memory, a stored program, and the like so that the parameters can be properly analyzed and a useful result provided to the user.

The items of data input to a battery tester are referred to herein as "context parameters". Input of these context parameters to the tester is needed in order that the measured parameters of a particular battery under test can be meaningfully compared to nominal specifications of a similar battery in good condition. The context parameters are used to select an appropriate algorithm to calculate battery health and condition with reasonable accuracy. Without such context parameters, the measured values derived from a battery are insufficient to determine battery health or condition.

For example, ohmic testers typically perform the step of measuring the battery's "open-circuit voltage" ("OCV"), that is, the voltage across the battery when disconnected from external loads. Suppose an OCV of 6.4 V is measured. Absent knowledge of the battery's nominal voltage rating, it is impossible to determine whether an OCV of 6.4V is indicative of a good or bad battery, or a charged or discharged battery. If the device (or the user) knows that the battery should have a fully charged voltage of 12.6V, an OCV of 6.4V indicates that the battery is substantially discharged and possibly defective. However, if the battery context parameters indicate that the battery is nominally a 6V battery, an OCV of 6.4V indicates that it can be considered to be fully charged. (It will be appreciated by those of skill in the art that this alone does not establish that the battery is in good condition, merely that it is fully charged. Additional measurements and context information are required to determine the condition of the battery.)

When using ohmic testing to determine the condition of a battery, certain context parameters must be used to determine a qualitative test result from the raw data measured by the tester. Such battery context parameters may include, for example, nominal or expected battery voltage, nominal battery capacity or rating, battery rating system, battery construction type, nominal battery size, battery manufacturer, battery chemistry, battery age, battery temperature, battery pack configuration, battery location, test point location, terminal type, terminal material, battery model, etc. In existing commercial battery testers, such context parameters are typically determined by the user and appropriate values are sequentially entered by the user into the tester.

More specifically, depending upon the test application, a critical few or many context parameters must be entered by the user before a test can be performed and qualitative results determined. This necessitates that the tester comprise a user interface for entering these values. The user interface of the typical integrated battery tester is a display screen of some type, and a keyboard, keypad, or set of buttons that the user presses in sequence to enter or select values, typically in response to prompts displayed on the screen. Through this interface the user selects appropriate context values for the test, initiates the test, and performs post-test operations, such as viewing test results, and printing or saving the results. The user interfaces provided in current commercial battery testers are typically cumbersome, requiring an excessive number of button presses, so as to be time consuming to operate. Further, current user interfaces can be confusing to operate without instructions.

After the context parameters are entered, the user initiates a battery test. The tester will measure certain raw data parameters from the battery. Typically, only two or three raw parameters are measured, such as voltage and an ohmic value, and occasionally temperature. However, many other parameters are measurable and could be useful in determining the health of the battery, including: capacitance, reactance, inductance, fluid levels, specific gravity of the electrolyte, current, etc., and are accordingly within the scope of the invention. These raw measured parameters are then used in a complex set of algorithms to determine qualitative results as a function of the entered context parameters. These qualitative results indicate a condition of the battery and may include, for example, estimated cold cranking amps, state of charge, state of health, remaining battery life, cranking health, and others. These determined qualitative values are then compared to the context parameters input by the user in order to determine a conclusion, typically a pass or fail condition. These calculations are performed using a microprocessor and are typically displayed on the screen of the user interface, and may be printed or saved in a memory on the device for future reference. It is also known to start the engine of the vehicle and measure the minimum voltage across the battery during cranking, indicative of battery health, and to measure the voltage and current ripple after the engine starts, indicative of alternator performance.

In more complex battery testing environments, for example, testing a parallel pack of batteries, or testing and comparing multiple batteries in a series string of batteries, the tester hardware and firmware must accommodate a lengthy and complex test sequence, e.g., instructing the user to perform multiple steps and then storing and comparing qualitative and quantitative results from numerous tests.

As battery testing has evolved and the results of battery tests are becoming more important in the process of quality improvement and battery warranty management, it is desirable to be able to extract the test reports or test records from the test device so that they may be collected and further analyzed or shared, or combined with other information to provide management reports, for example. This process of saving and exchanging information is often cumbersome and expensive. Normally, providing this capability will require memory on board the device to store a large number of test records, along with an interface to allow the files stored by the device to be transferred to another device, for example, to a computer system for tracking data for a fleet of vehicles. Methods for this transfer of stored data to another device include use of removable memory cards, or of on-board memory that is readable through a data port, such as a serial or "USB" port connected to a computer. Alternative methods include a "WiFi", "Bluetooth" or other radio or infrared connection between the tester and a remote device such that test reports can be sent to a network location.

Thus, it can be seen that while the function of a battery tester per se is comparatively simple in that only a very few raw data parameters can possibly be determined from the battery itself, commercially available battery testers have become very complex and expensive in order to provide useful qualitative results that indicate battery condition and provide actionable recommendations for a wide variety of battery types, and furthermore in order to provide the ability of securing and exchanging results and reports, printing results, sending results to a remote device for further analysis, and the like.

Similar concerns apply in the case of other forms of specialized integrated test equipment, for example, specialized equipment for reading diagnostic data from an automobile's "on-board diagnostic" (OBD) port, equipment for verifying proper performance of telecommunications facilities, and many others. More specifically, there are numerous examples of testers of various kinds wherein the actual collection of data, downloading of status codes, performance of simple tests and the like is a simple matter as compared to analysis of the test results, receiving needed context data, providing a user interface, communication of the results to other devices, and the like.

OBJECTS AND SUMMARY OF THE INVENTION

Therefore, it is an object of this invention to provide a low cost, simplified device for testing equipment, apparatuses, or components, that is, for measuring useful parameters of the equipment, apparatuses, or components, downloading stored data, performing tests, and the like, and for transmission of the measured values to an associated external "smart" device also useful for other purposes for analysis of the parameters derived from the test, communication of the results to associated devices, and the like. A tester according to the invention thus comprises a simplified testing device and an appropriately programmed smart device.

In the battery testing context, the simplified battery testing device measures the basic battery parameters of interest—typically open circuit voltage, an ohmic value for the battery's internal resistance, and temperature—and sends this raw data in any convenient manner to the smart device for analysis, interpretation, results determination, and any further processing of test data. More specifically, in this way, the external smart device, not the battery testing device, is provided with memory, a user interface for capturing battery test context information, and circuitry for displaying, storing, and transmitting results and test reports.

The external smart device as noted is also useful for other purposes, such that it is not dedicated to the sole purpose of battery testing per se. More specifically, the external smart device can be a "smart phone", tablet computer, laptop computer or the like. Thus separating the function of the prior art battery testers between the simple, low cost battery testing device and the preexisting external smart device according to the present invention has many advantages discussed in further detail below.

Summarizing, these advantages include: substantially reduced cost of the battery testing device, as the dedicated test circuit can be very simple; allowing input of the context parameters by means of the sophisticated user interface already provided by the external smart device, simplifying this task for the user; allowing employment of the memory and computational capabilities of the smart device to carry out the analysis of the raw data; and allowing employment of the sophisticated communication capability of the smart device to provide convenient communication of test results to a remote device. Furthermore, according to the invention the image sensor comprised by such smart devices can also be employed for several purposes, as detailed below.

Noting as above that the testers of the invention have applicability to uses other than battery testing per se, stated somewhat differently, distribution of the data measurement and analysis functions between a simplified testing device and a preexisting smart device capable of other uses allows "leveraging" of the capabilities of the smart device, which are generally far more sophisticated than prior art integrated testers. This allows a technician, for example, who will typically have a smart device for personal and business use, to employ this device together with one or more simplified testers, each dedicated to simply obtaining useful raw data from a variety of different equipment, apparatuses, or components.

For example, it is easy to imagine an auto mechanic to have (or be provided with) a simplified battery testing device and a different simplified device for connection to the "on-board diagnostic" (OBD) port provided on modern vehicles for downloading various items of data useful in verifying vehicle operation and tracking flaws. Both would read raw data and transmit it to a smart device for analysis. Equipped with these and a smart device, the mechanic could avoid the cost of purchase of a separate integrated battery tester and OBD test equipment, saving substantially on the cost of needed tools. Further, the smart device would be useful for all the purposes for which such devices are used, personal as well as professional, so that the cost of the smart device would not be attributable to the mechanic's tool budget.

Referring back to an embodiment of the invention wherein the simplified testing device is dedicated to battery testing (but recalling always that the invention is not so limited) in order to further explain the objects and advantages of the invention, and noting that many of these objects and advantages are not limited to battery testing, but may be useful in testing various sorts of equipment, apparatuses and components:

It is an object of this invention to utilize the user interface, processor, memory, image sensor, communication facility, the ability to conveniently download software adapting the smart device to analysis of data provided by various simplified testing devices, and other components and capabilities of a external smart device, not the battery testing circuit, for purposes such as interacting with the user, capturing battery context information, calculating qualitative results, and managing results, thus reducing the cost and complexity of the dedicated battery testing device.

It is a further object of this invention to utilize the human interface, image sensor, communication, and processing assets of a portable device such as a smart phone or tablet computer to perform the tasks of accepting battery context information input by a user, executing algorithms to calculate qualitative battery test results, and displaying and/or transmitting these results, thus avoiding the cost and complexity of including user interfaces, keyboards, communication systems, memory, and other elements in a dedicated battery tester, as required by prior art integrated battery testers.

It is yet another object of this invention to provide a simplified battery testing device that measures basic battery values and communicates this information to a remote smart device. The remote smart device is configured with software that interfaces with the user to prompt the user for input of context information and prompts the user through a series of actions and inputs to complete a qualitative analysis of the battery. The remote smart device is configured to run any one of many different software programs, each program specifically tailored to the analysis of a particular type of battery or battery application. The remote device software is configured such that the software can be updated at any time to improve or modify the analysis algorithm, e.g., by a conventional software download, such that the simplified battery testing device need not be provided with the ability to be updated to provide improved results.

More particularly, because the simplified testing device only produces raw data, the need to improve its performance or update its capabilities—e.g., as new types of batteries become available—is very unlikely. New methods, algorithms, battery applications, and context information characteristics can be adopted and integrated into final qualitative results by a simple software download to the smart device, and without having to make any modifications to the simplified testing device. Such changes can be quickly and easily made in the software that resides on the remote smart device, by simply updating the application software. This method vastly increases the range of battery types, configurations, and applications that can be tested using the same simplified battery testing device.

It is another object of this invention to provide a simplified battery testing device that communicates raw objective battery parameter information quickly and conveniently to a remote smart device using a simple and low cost method. This simple and low cost communication between the simplified battery testing device and the smart device can be accomplished in a variety of ways, each well known to the art in other fields of use.

For example, the raw battery parameter information can be quickly and conveniently transmitted from a simplified testing device to a remote device by a wired communication technique, using a communication interface and communication bus such as serial communication carried out using the well-known USB communication technique. Alternatively, the raw battery parameter information can be transferred quickly and conveniently from a simplified test device to a remote device using a wireless communication interface such as those used by the well-known "WiFi" or "Bluetooth" radio communication technique. Such wired and radio communication techniques are supported by today's smart devices and can readily be implemented in a simple battery testing device.

However, both wired and radio communication techniques are subject to certain possible complications; the cables needed for wired communication can be lost or damaged, and the standards for WiFi or Bluetooth radio communication may vary over time. If these could be avoided in favor of a simpler communication technique—noting in particular that there is no particular reason for there to be communication from the smart device to the simplified battery testing device, only in the opposite direction—a further advantage would be provided.

Therefore, it is a further object of this invention to provide a method of transferring raw battery parameter information from a simplified battery testing device quickly and conveniently to a remote smart device in a manner avoiding a wired data or communication bus, or a radio transmission technique. Such a method allows for a very low cost and trouble free battery testing device.

According to this latter aspect of the invention, raw battery parameter information is transferred from a simplified battery testing device to a smart device by enabling the simplified testing device to display a graphical image such as a bitmap image that is visually recognized by a remote smart device. As the conventional smart devices now all include an image sensor and are capable of employing sophisticated software for recognizing such bitmaps and reading data therefrom, providing the communication from the simplified battery testing device to the smart device in this manner does not involve any complication of the functions already provided by the smart device; the battery testing device need merely be capable of displaying a bitmap including the raw data in a form recognizable by the smart device, which is a simple matter.

One well-known form of such bitmaps is known in the industry as the "QR" code, which is conventionally used to transfer characters from, for example, a printed publication to a smart device. For example, a user may cause the camera of his or her smart phone to scan a QR code in a magazine advertisement; the QR code commonly stores a web address, which can then be immediately employed by the smart phone to access the advertiser's web site. Such QR codes can be readily generated to encode raw data—for example, measurements carried with respect to a battery to be tested—and displayed on a screen of a simplified battery testing device, and read therefrom by the smart device. Therefore, it is an object of this invention to provide a means and method of quickly and conveniently transferring raw battery parameter information from a simplified battery testing device by enabling the simplified testing device to display a QR code that includes the battery parameter information. The QR code is visually captured by an image sensor or camera of the remote smart device. The smart device then employs the raw data communicated by way of the QR code and the battery context information input by the user to evaluate the battery, as discussed above.

It is also within the scope of the invention to collect plural sets of raw data and transmit these from the simplified battery testing device to the smart device in separate operations. For example, the simplified battery testing device can measure voltage, temperature and resistance and display a QR code with those three values, and then wait for an engine starting sequence. If it senses an engine starting sequence, it will capture the cranking voltage (that is, the minimum voltage reached by the battery during engine starting), alternator voltage, and alternator ripple. After it gathers these values, it will generate and display a new QR code that includes these additional values. The smart device will receive the QR codes in sequence, analyze the data, and display the qualitative result.

It is desired to prevent unapproved software applications to utilize the measurement values produced by the simplified battery testing device—that is, it is desired to prevent unauthorized vendors from selling software for smart devices that will allow them to interact functionally with the simplified battery testing device of the invention. Accordingly, it is a further object of this invention to transfer the raw battery parameter information from a simplified battery testing device to a remote smart device after first encrypting the raw battery parameter information into a series of values that are not directly representative of battery measurements, then converting these encrypted values into a graphical image that can be scanned by a remote device. In this embodiment of the invention the remote smart device includes software that is enabled to decrypt the data such that the values can be analyzed as a function of battery context information and used to determine qualitative battery performance information.

It is an object of this invention to improve the accuracy and reliability of battery measurements by automatically measuring one or more battery attributes more than once and automatically comparing results to ensure that the measured values are consistent within an acceptable range. If the results are consistent within an acceptable range, the values of the sequentially measured results may be automatically averaged to produce an average value, or otherwise statistically modified to produce a result that is most representative of the true measurement. If the sequential results are not sufficiently consistent, then the simplified battery testing device will automatically measure the attribute n more times, where n could be any value of one or greater, and the results further analyzed for consistency. If the results are not sufficiently consistent, the testing device may clearly indicate a failed test on the display, or generate a graphical code that when scanned by a remote device indicates a failed test so that the user can initiate a new test.

It is a further object of this invention to quickly and conveniently add useful identification information to a test record such that the test report can be easily attributed to a particular battery, vehicle, installation, location, building, or other useful identifying attribute. This can be easily done by adding such identifying information through the use of hardware and software assets that already exist on a remote smart device.

For example, in the vehicle context, either before or after the remote smart device scans the display of the simplified battery testing device to capture the graphical code containing simplified battery measurements, the software on the remote smart device can prompt the user to add identifying details of the battery or vehicle. These details could include the vehicle identification number (VIN), which can be optically scanned or photographed by the image sensor of the remote smart device, and then stored in conjunction with the battery condition information for later use. In this connection, the scanned image of a human-readable version of the VIN can be converted by the software, using optical character recognition, to an alphanumeric string representing the vehicle identification number and stored as a field along with the other data associated with the battery. Alternatively, the VIN number may be provided on the vehicle in bar code form that can be scanned by the image sensor of a remote device and converted to an alphanumeric code.

Other useful identifying information that can be similarly captured and stored with the test report includes a battery bar code, serial number or part number, a photograph of the battery, the vehicle license plate number, the number of a vehicle belonging to a fleet of vehicles, the location of the test as determined by an on-board GPS in the remote smart device, a photographic image of the installation of the battery, or any other information that is useful to identify the battery being tested.

It is yet a further object of the present invention to integrate battery test report information automatically with other service information related to a particular vehicle in a service setting. After simplified battery measurement information is obtained by the remote smart device and converted into battery condition information as a function of the context information, a battery test report is created. This battery test report includes battery identification information that can be correlated with a particular vehicle or owner. By using one or more related identifying values, the battery test report can be automatically combined with other records related to the same vehicle, vehicle type, or owner.

As mentioned above, while described principally herein in the context of battery testing, the invention has applicability to testing of numerous forms of equipment, apparatuses, and components. In each case, a simplified testing device will be connected to the equipment, apparatus, or component to be tested, will measure raw data, collect stored data, and perform similar operations to ascertain raw data that can be analyzed to determine the condition of the equipment, apparatus, or component, and will then transit the raw data to an associated smart device. The smart device will then perform the analysis, typically after input of context parameters indicative of the normal operation of the equipment, apparatus, or component, and provide useful output. Again, in this way the cost of the testing device can be minimized, and the highly sophisticated analytical, display, user interface, image capture, data storage, software update, and communication capabilities of the smart device can be leveraged over numerous uses.

Other aspects and attributes of the invention will become apparent to those of skill in the art as the discussion below proceeds.

BRIEF DESCRIPTION OF THE DRAWINGS

The invention will be better understood with reference to the accompanying drawings, in which:

FIG. 1 shows an overall view of a battery tester with distributed measurement and analytical functions according to the invention;

FIG. 2 shows a view of a screen of the simplified battery testing device illustrating a typical QR code, readable by a remote smart device;

FIG. 3 shows a block diagram of the components of the simplified battery testing device;

FIG. 4 shows a schematic flowchart of typical functions carried out by the simplified battery testing device of the invention.

DETAILED DESCRIPTION OF THE PREFERRED EMBODIMENTS

Figure 5:
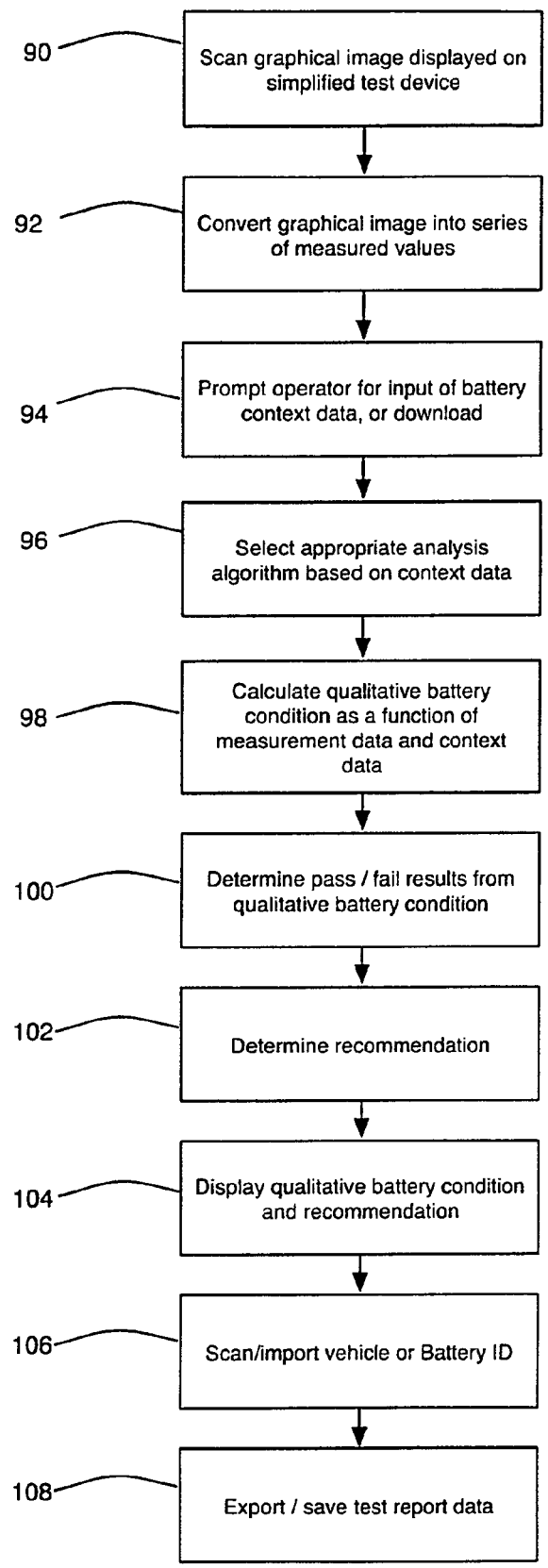
FIG. 5 shows a flowchart of typical analytical software employed by the remote smart device to analyze the measured battery parameter information.

As mentioned above, FIG. 1 shows an overall view of a tester with distributed measurement and analytical functions according to the invention. The tester is shown in the context of testing a vehicle battery, but the invention is not limited thereto, as more fully detailed below.

As discussed above, the basic function of measuring battery parameters, typically the OCV, ohmic value and temperature of a battery 10 is carried out by a simplified battery testing device 12, when "powered-up" by being connected to the battery 10. The technique employed for measuring the ohmic value may be generally as described in the Huang patents referenced above, and as summarized below, or otherwise. Values other than those mentioned may also be measured, as noted above.

In a more sophisticated test, the user may be prompted to start the vehicle's engine after the basic parameters mentioned above have been measured. This will result in additional measurements, typically the minimum voltage measured across the battery during cranking of the engine, useful in evaluating the battery, and the voltage and ripple frequency detected after the engine starts, useful in evaluating the alternator. The steps involved in performance of these tests are described below with reference to FIG. 4.

After the tests supported by the simplified battery testing device 12 have been performed, as above, the simplified battery testing device 12 then transmits this raw battery parameter data to a remote smart device 14, as indicated at 16.

Such smart devices 14, typically including the devices known colloquially as smart phones or tablet computers, and including therein other devices with the capabilities required, have several built-in features that are employed in implementation of the invention. For example, such smart devices include image sensors, which are connected to image processing circuitry and software such that they can decode symbols such as a so-called QR code, yielding an alphanumeric string of letters and numbers. These smart devices are also provided with memory and significant processing power, with the ability to download software (commonly referred to as an an "app", for "application") adapting the device to a new use, and with the ability to communicate in any of several ways. Thus, in order to adapt a preexisting smart device for use in connection with the present invention, one simply need download appropriate software including software implementing the steps shown in FIG. 5 and discussed below.

As mentioned above, the raw data can be transmitted from the simplified battery testing device 12 to the smart device 14 in any of several ways, including wired or radio connection. At present the preferred method is by way of display of an encoded version of the raw data on a screen 13 of the battery testing device 12, e.g., in the form of a QR code (see FIG. 2), and read therefrom by an image sensor or camera comprised by the smart device 14. The smart device 14, having been provided with battery context information such as the battery rating (for example, by user input via a touch screen 18), then analyzes the raw data according to a stored algorithm, and determines the battery condition.

Optionally, the smart device 14 may transmit the battery condition data to a remote computer 20, e.g., to the service bay workorder system of a dealership or service center. In that case the smart device 14 will preferably also transmit vehicle identification data, such as the VIN, readable by the smart device from the label 22 provided on all vehicles, as indicated at 24, or the vehicle's license plate number 26, likewise readable by the smart device 14, and as indicated at 28. The battery condition data and other identifiers can alternatively or additionally be printed via printer 25.

As noted above, the smart device 14 will normally require battery context information, typically including the battery's nominal specifications, in order to perform its analysis. The user can input this information directly, responsive to prompts displayed on the screen of the smart device. Alternatively, the smart device may obtain this data by user input of a battery identification, such as the part number, followed by downloading the battery's specification from the Internet, e.g., from the battery manufacturer's web site, as indicated at 30. The smart device 14 may also be enabled to read the battery's identification from a bar code, RFID memory device or like identifier 27 on the battery 10, where provided, and likewise obtain its nominal specifications from the internet if the relevant specifications are not already contained in the RFID info or bar code.

FIG. 2 shows a schematic view of the simplified battery testing device 12 according to the invention. As illustrated, device 12 comprises a central unit 32, which contains the circuitry necessary to carry out the functions described, as discussed in more detail below in connection with FIG. 3, a display 13, and positive and negative spring clamps 34 and 36 for being conveniently attached to the poles of a battery 10, as illustrated in FIG. 1. Clamps 34 and 36 are connected to the internal circuitry of device 12 by cables 38 and 40, as conventional. Clamps 34 and 36 and their associated cables 38 and 40 may implement so-called Kelvin clamps, as commonly used, comprising separate conductors for signal-level currents, such as the voltage across the battery 10, and heavier currents, such as the current drawn when a load resistor is connected across the battery in order to measure its internal resistance. See the Huang patents referenced above. One of clamps 34 and 36 may include a temperature sensor 42 for measuring the temperature of the battery 10.

FIG. 3 shows a block diagram of the components of the simplified battery testing device 12 of the invention. These include a microprocessor control unit (MCU) 44, display 13, cables 38 and 40 connecting the MCU 44 to the battery 10 to be tested, and a transistor switch 46. As noted above, cables 38 and 40 may terminate in Kelvin clamps 34 and 36 respectively. Where used for other types of tests, the MCU will store and run software optimizing the tester 12 to testing a particular type of equipment, apparatus, or component, and the tester will be provided with suitable connecting components.

FIG. 4 shows as mentioned above the basic steps in the process carried out by the simplified battery testing device 12 when it is connected to a battery. At step 50, the device 12 is connected; the process begins immediately upon thus "powering-up" the testing device 12. As indicated at 52, there is an initial delay for a period of N (e.g. five) seconds, to allow any transients to settle out, e.g., to make certain that the clamps 34 and 36 are in good contact with the terminals of battery 10.

At step 54, the device 12 carries out a number X of identical measurements of fundamental parameters of the battery 10. As discussed above, these measurements will typically include an initial measurement of the open-circuit voltage (OCV) across the battery. A "ohmic" value for the internal resistance r of a battery 10 then can be derived by measuring the voltage $V_B$ (equivalent to OCV) across the battery, employing contacts 47 and 47', connecting a load of known resistance R across the battery for a short period of time by closing switch 46 so that a single short pulse of large current I is drawn from the battery, via contacts 43 and 43', and measuring the voltage $V_R$ across the load R employing contacts 45 and 45', while again measuring the voltage $V_B'$ across the battery. The current I drawn from the battery is then calculated by $I=V_R/R$, and the internal resistance r of the battery calculated by $r=V_B-V_B'/I$. Again, see the Huang patents referenced above, noting that the invention is not thus limited. The result is values for the OCV and internal resistance; the temperature of the battery 10 may also be measured, employing contact 42, as noted.

As indicated by steps 56, 58, and 60, the measurement step 54 can be repeated a number X of times, to ensure accuracy.

When the measured battery parameter data thus determined is deemed reliable, it may be compressed, as indicated at step 62, and may be encrypted as indicated at step 64, before being transmitted at step 68. The compression and encryption steps may take the form of transforming the data, as measured in a base-10, decimal format, to a different format, e.g., hexadecimal format. This has the effect of reducing the number of characters that need to be transmitted—thus providing a data compression function—and also to render the data transmitted (again, by way of a QR code or the like) much more difficult for an unauthorized user to decode—providing an encryption function. More specifically, any smart device can read the QR code and obtain from this an alphanumeric string, but without specific knowledge of the algorithm needed to transform this string into data representative of the measured battery parameters the alphanumeric string per se is useless. In addition to the battery parameter data, an identification of the simplified battery testing device 12 may be transmitted, as indicated at step 66. This would typically include the model and serial numbers of the device 12, and the software version it is employing.

Where the battery tester of the invention is being employed to test a battery employed as an engine starting battery, the user may be prompted to start the engine at this point, or may simply do so after the passage of a few seconds, as indicated at step 70. The testing device 12 will then make secondary measurements as indicated at step 72; as discussed above, these will typically include the minimum voltage exhibited across the battery during starting, and the voltage and ripple frequency exhibited after starting. The former is indicative of battery health, and the latter of alternator function.

After these secondary measurements are completed the resulting data can be compressed and encrypted, as above, at steps 74 and 76, and both the primary and secondary data transmitted, again preferably by way of generation of a QR code displayed on screen 13 of testing device 12.

It is to be understood that while a QR code is at present the preferred form of code to be used to transfer data from the simplified testing device to the smart device, other forms of optically machine-readable data transfer formats may be used and are accordingly within the scope of the invention. For example, a single-dimension code such as a bar code can be used, or other forms of two-dimensional "bitmaps", comparable to the QR code, may be used. Accordingly, reference herein to use of a QR code is to be understood to include other forms of code suitable for the purposes mentioned.

FIG. 5 shows the principal steps performed by the smart device 14 in receiving the raw battery parameter data measured with respect to a specific battery 10 under test from the simplified battery testing device 12, analyzing the data with reference to context parameters describing the battery's nominal characteristics, determining the condition of the battery, and communicating the results in useful form.

Thus, at step 90, and assuming that simplified battery testing device is enabled to display (possibly compressed and/or encrypted) data on its screen in code form, e.g., as a QR code, the smart device 14 scans the QR code. As noted above, all devices within the definition of "smart devices" as used herein have (when the corresponding app has been downloaded) the capability of thus scanning QR codes and converting the QR codes to an alphanumeric string. This is performed at step 92; if the raw data has in fact been compressed and/or encrypted, the smart device 14 will have had downloaded to it, as part of the app allowing the device to function according to the invention, the software needed to convert the QR-coded data to a series of measured values.

At step 94, the user provides the smart device 14 with the context information describing the battery's nominal specifications and other context information that are useful to determine qualitative results. This can be done in several ways. The operator can be prompted to enter key values, such as the battery's rating, that are normally printed on the battery; the operator can enter the battery part number, and the smart device can download the key data from the manufacturer's web site; or the operator can use the smart device 14 to capture battery identifying information from the battery such as by scanning the bar-coded label found on the battery, obtaining the battery part number, and then download the needed context information. Where the tester of the invention is used to regularly test a number of identical batteries, as in, for example a fleet vehicle scenario or stationary battery bank situation (discussed further below), the context information can be permanently stored in the smart device, eliminating the repetitive input step.

At step 96, the smart device selects an appropriate algorithm for analysis of the raw data, employing the context information. For example, it is known that batteries that are partially discharged can nonetheless be evaluated, but that different battery types require different "compensation curves". See McShane et al U.S. Pat. No. 5,821,756. By inputting the battery context information, such as part number, or alternatively battery type, battery rating, and like information, the smart device is empowered to select the correct algorithm for analysis of the raw data.

Thus, at step 98, the context information and the measured data are used to calculate qualitative battery condition; for example, whether the battery is healthy but discharged, fully charged but not in good condition, and the like. In step 100 the battery is determined to pass or fail this test, and in step 102 a recommendation (e.g., "battery OK" or "replace battery") is made. This information is then displayed at step 104 on the screen of the smart device.

At step 106, the smart device 14 may be used to gather additional information concerning the battery; for example, if it is installed in a vehicle, the vehicle identity number (VIN) can be captured by scanning the label installed in all modern vehicles. Alternatively, the vehicle license plate information or the number identifying the vehicle in a fleet can be captured. This vehicle identification information is then stored along with the qualitative battery condition information.

Finally, at step 108, the stored information can be exported, e.g., to a service center's central computer or the like.

The graphical bitmap method of displaying battery attributes as described above can also be applied to simplified battery test circuits that are designed for semi-permanent attachment to batteries. In this embodiment, the simplified battery testing device 12 functions as a continuous battery performance monitor, and the graphical image is periodically updated to represent the most recent measurements. By scanning the device 12 at any time with a remote smart device 14, the current measurements of the battery can be captured and analyzed and qualitative status results calculated and displayed.

Although the invention has been described in the context of testing vehicle batteries, it has uses elsewhere in the battery testing industry. For example, it is commonplace to employ large banks of "stationary" batteries for such purposes as providing back-up power to provide emergency power supply for such uses as traffic control signals, hospitals, telecommunications and other critical facilities. Such banks of batteries are normally kept fully-charged, so that the question of testing possibly discharged batteries does not arise. However, such batteries do lose storage capability as they age, and it is important accordingly to monitor their decline. This is normally done by making ohmic measurements, as above.

According to the invention, the complex and expensive battery testers now used for this purpose, which typically comprise test circuitry for making such ohmic measurements together with a user interface for allowing the user to enter a battery identification number or the like, memory for storing the results associated with each battery, communication facilities for transmitting reports to a central computer tracking the results, and so on, can be replaced by the simplified battery testing device and smart device according to the invention.

In such a use, the simplified battery testing device 12 would be connected in succession to each battery to be tested, and perform the basic ohmic measurement discussed above, that is, measure the internal resistance of the battery. This would then be transmitted to the smart device 14 as above, and the smart device 14 would likewise be employed as above to analyze the raw data to evaluate the battery with reference to a standard for batteries of that type, and record the result along with an identification of the battery. The results for a large number of batteries tested could then be downloaded to a central computer, printed out, or the like.

Alternatively or additionally, results from a battery test on one day can be compared with prior test results for the same battery to determine trends. The battery test results may be stored in the smart device or stored in a remote database that is dynamically accessible by the smart device. In this way the operator may identify a battery that has been previously tested using any of the battery identity details discussed above. Once the battery has been identified, the current test results are automatically compared to the previous results to provide battery decay rate information.

Finally, as noted above, while the tester of the invention has been described in detail in the battery testing context, it is not limited thereto but has applicability to testing of numerous different types of equipment, apparatus, or components. As mentioned above, in each case a simplified testing device would be provided with appropriate components to connect the MCU of a testing device to the circuitry of the equipment, apparatus, or component to be tested, and the MCU would be programmed with appropriate software, for example, to perform a physical measurement of a value (as in the battery testing embodiment), to interrogate an internal memory (as in the OBD example), or otherwise. The simplified testing device would then transmit this information to an associated smart device for analysis and appropriate action.

In addition to the battery testing and OBD download capabilities of testers according to the invention already discussed, there are numerous applications for testers according to the invention, both within and without the automotive industry. For example, telecommunications facilities are commonly tested using testers that measure such parameters as data rate, to verify that the subscriber is receiving the promised service. Such testers are now commonly integrated, as above; that is, they comprise both circuitry for applying a test signal to the facility and measuring its response, and a microprocessor with appropriate software for analyzing the results, receiving user input via a user interface, and reporting the results. As above, the tester of the invention can thus comprise a simplified test device for performing the basic test operation, and for communicating the raw data resulting therefrom to a smart device, together with an appropriately-programmed smart device for analysis, user input, reporting of results, and the like.

Accordingly, the principal function of the simplified tester of the invention can be described generically as obtaining data indicative of the condition of the equipment, apparatus or component to be tested—again, including in this terminology such things as measuring a value (as in the battery case), downloading stored data (e.g., downloading data representative of the condition of a vehicle from its OBD port), or injecting a signal into a circuit and measuring its response (as in the case of telecommunication testing)—and transferring the data thus obtained to the smart device. As discussed, the smart device, having been provided by appropriate software (typically by download of software offered by the proprietor of the particular testing device) then determines the condition of the equipment, apparatus or component responsive to the obtained data.

Therefore, while a preferred embodiment of the invention has been described in detail, numerous improvements and enhancements are within the skill of the art, and are accordingly within the scope of the invention where not excluded by the following claims.

What is claimed is:

1. A tester specifically designed to test batteries of varying types and sizes, wherein said tester is incapable of performing test functions other than testing batteries and associated equipment, said tester being adapted to:
   1) be temporarily connected to a particular battery to be tested,
   2) measure an open-circuit voltage and temperature of said particular battery,
   3) apply an electrical signal to said particular battery in order to perform a specific test thereon,
   4) obtain data, responsive to said test, indicative of an ohmic value of said particular battery, and
   5) communicate values representative of said open-circuit voltage and temperature of said particular battery and of said data indicative of the ohmic value of said particular battery to a smart device independent from the tester; and
   wherein said smart device is capable of other uses, and is adapted by software stored therein corresponding to said tester to:
   receive said values and data communicated by said tester;
   receive nominal data relating the ohmic value of batteries of the type and size of said particular battery to their condition by download;
   analyze the received values and data with respect to the nominal data to determine the condition of the particular battery; and
   provide an indication of the condition of said particular battery.

2. The tester of claim 1, wherein said tester is further adapted to display an optical code readable by said smart device on a screen comprised by said tester, said optical code representing said values and data obtained by said tester with respect to said particular battery, and wherein said smart device is further adapted by software to read said optical code using an image sensor device comprised thereby and derive said values and data obtained by said tester therefrom.

3. The tester of claim 2, wherein said optical code is a bar code.

4. The tester of claim 2, wherein said optical code is a two-dimensional code.

5. The tester of claim 4, wherein said two-dimensional code is a QR code.

6. The tester of claim 1, wherein said smart device capable of other uses is a smart phone.

7. The tester of claim 1, wherein said smart device capable of other uses is a tablet computer.

8. The tester of claim 1, wherein said smart device is further adapted by software to transmit said determined indication of the condition of said particular battery to be tested to a remote computer device.

9. The tester of claim 2, wherein said smart device is further adapted by software to employ an image sensor device comprised thereby to read an identification of said particular battery to be tested, and to use the identification of the battery to obtain nominal data characterizing the specific model of the particular battery.

10. The tester of claim 1, wherein said smart device is further adapted by software to employ an image sensor device comprised thereby to read an identification of a vehicle with which said particular battery is associated.

11. The tester of claim 1, wherein said smart device is further adapted by software to receive said nominal data in respect of said particular battery to be tested by receiving an indication of the identification of said particular battery and downloading said nominal data from the internet.

12. The tester of claim 11, wherein said smart device receives an indication of the identification of said particular battery by user input.

13. The tester of claim 11, wherein said smart device receives an indication of the identification of said particular battery by employing an image sensor device comprised by the smart device to read the identification of said particular battery directly therefrom.

14. The tester of claim 1, wherein said tester measures further parameters during an engine starting sequence, during which said particular battery provides power to a starter motor to start an engine.

15. The tester of claim 14, wherein said further parameters include at least the minimum battery voltage experienced during said starting sequence.

16. The tester of claim 14, wherein said tester first communicates values representative of said open-circuit voltage, temperature and an ohmic value of said particular battery to said smart device and subsequently communicates values representative of said further parameters to said smart device.

17. The tester of claim 14, wherein said tester communicates said values representative of said open-circuit voltage, temperature and an ohmic value of said particular battery and said values representative of said further parameters by successive display of one or more machine-readable codes readable by said smart device.

18. The tester of claim 1, wherein said tester is connected to a particular battery to be tested by Kelvin clamps and cables carrying plural conductors.

19. A method of determining the condition of a particular battery, comprising the steps of:
   1) connecting a simplified testing device specially designed to test batteries of varying type and size and associated equipment and incapable of testing other forms of equipment, apparatus, or components to a particular battery to be tested;
   2) employing said simplified testing device to A) measure the open-circuit voltage and temperature of the particular battery and B) perform a test and obtain data indicative of an ohmic value of the particular battery;
   3) employing said simplified testing device to communicate a message to a smart device capable of other uses, said message including the values measured for the open-circuit voltage and temperature of the particular battery and the data indicative of the ohmic value of the particular battery;
   4) employing said smart device, having been programmed by a program corresponding to said test device, to obtain information characterizing the particular battery's nominal characteristics by download; and
   5) employing said smart device to evaluate the determined condition of the particular battery from said values and data included in said message and said information characterizing the battery's nominal characteristics.

20. The method of claim 19, wherein said smart device capable of other uses is a smart phone.

21. The method of claim 19, wherein said smart device capable of other uses is a tablet computer.

22. The method of claim 19, wherein said smart device is further adapted by software to transmit said determined indication of the condition of said particular battery to be tested to a remote computer device.

23. The method of claim 19, wherein said smart device is further adapted by software to employ an image sensor device comprised thereby to read an identification of said particular battery to be tested, and to use the identification of the battery to obtain nominal data characterizing the model of the particular battery.

24. The method of claim 19, wherein said smart device is further adapted by software to employ an image sensor device comprised thereby to read an identifying characteristic of a vehicle with which said particular battery is associated. by software to employ an image sensor device comprised thereby to read an identifying characteristic of a vehicle with which said particular battery is associated.

25. The method of claim 19, wherein said smart device is further adapted by software to receive nominal data in respect of said particular battery to be tested by receiving an indication of an identification of said particular battery and downloading said nominal data from the internet.

26. The method of claim 19, wherein said testing device further measures at least the minimum voltage reached by said particular battery during starting of an engine in said message.

27. The method of claim 19, wherein said simplified testing device is connected to a particular battery to be tested by Kelvin clamps and cables having plural conductors.

28. The method of claim 19, wherein said step of employing said simplified testing device to communicate a message to a smart device capable of other uses is performed by:
   a. displaying on a display screen comprised by said simplified testing device a machine-readable optical code readable by a smart device, said code including said values and data obtained with respect to said particular battery; and
   b. employing said smart device capable of other uses to read said code from said display screen.

29. The method of claim 28, wherein said machine-readable optical code displayed on the display screen comprised by said simplified testing device and read therefrom by said smart device is a bit mapped code.

30. The method of claim 29, wherein said bit mapped code displayed on the display screen comprised by said simplified testing device and read therefrom by said smart device is a QR code.

31. The method of claim 28, wherein said machine-readable optical code displayed on the display screen comprised by said simplified testing device and read therefrom by said smart device is a bar code.

32. The method of claim 24, wherein said identifying characteristic is the license plate number or vehicle identification number (VIN) of a vehicle with which said particular battery is associated.

33. The method of claim 19, wherein said simplified testing device measures further parameters of said particular battery during an engine starting sequence, during which said battery provides power to a starter motor to start an engine.

34. The method of claim 33, wherein said further parameters include at least the minimum battery voltage experienced during said starting sequence.

35. The method of claim 33, wherein said simplified testing device first communicates values representative of said open-circuit voltage, temperature and an ohmic value to said smart device and subsequently communicates values representative of said further parameters to said smart device.

36. The method of claim 35, wherein said simplified testing device communicates said values representative of said open-circuit voltage, temperature and an ohmic value and said values representative of said further parameters by successive communication to said smart device.

37. A tester specifically designed to test batteries of varying types and sizes, wherein said tester is incapable of performing test functions other than testing batteries and associated equipment, said tester being adapted to:
   1) be temporarily connected to a particular battery to be tested,
   2) measure an open-circuit voltage and temperature of said particular battery,
   3) apply an electrical signal to said particular battery in order to perform a specific test thereon,
   4) obtain data, responsive to said test, indicative of an ohmic value of said particular battery, and
   5) display an optical code readable by a smart device independent from the tester on a screen comprised by said tester, said optical code representing said values and data obtained by said tester with respect to said particular battery; and
wherein said smart device is capable of other uses, and is adapted by software stored therein corresponding to said tester to:
read said optical code using an image sensor device comprised thereby and derive said values and data obtained by said tester therefrom;
receive nominal data relating the ohmic value of batteries of the type and size of said particular battery to their condition;
analyze the received values and data with respect to the nominal data to determine the condition of the particular battery; and
provide an indication of the condition of said particular battery.

38. The tester of claim 37, wherein said optical code is a bar code.

39. The tester of claim 38, wherein said optical code is a two-dimensional code.

40. The tester of claim 39, wherein said two-dimensional code is a QR code.

41. The tester of claim 37, wherein said smart device capable of other uses is a smart phone.

42. The tester of claim 37, wherein said smart device capable of other uses is a tablet computer.

43. The tester of claim 37, wherein said smart device is further adapted by software stored therein to obtain said nominal data by download.

44. The tester of claim 43, wherein said smart device is further adapted by software stored therein to read an identification of the particular battery employing the image sensor device and to obtain nominal data characterizing the specific model of the particular battery by download.

* * * * *